(12) United States Patent
Ko et al.

(10) Patent No.: US 9,999,131 B2
(45) Date of Patent: Jun. 12, 2018

(54) PRINTED CIRCUIT BOARD WITH EMBEDDED ELECTRONIC COMPONENT AND MANUFACTURING METHOD THEREOF

(71) Applicant: Samsung Electro-Mechanics Co., Ltd., Suwon-si (KR)

(72) Inventors: Kyung-Hwan Ko, Gimhae-si (KR); Young-Gwan Ko, Seoul (KR); Jae-Ean Lee, Busan-si (KR); Jee-Soo Mok, Yongin-si (KR); Yong-Ho Baek, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 97 days.

(21) Appl. No.: 14/991,608

(22) Filed: Jan. 8, 2016

(65) Prior Publication Data
US 2016/0219712 A1   Jul. 28, 2016

(30) Foreign Application Priority Data

Jan. 23, 2015   (KR) ........................ 10-2015-0011203

(51) Int. Cl.
| | |
|---|---|
| *H05K 1/18* | (2006.01) |
| *H05K 1/11* | (2006.01) |
| *H05K 3/46* | (2006.01) |
| *H01L 23/28* | (2006.01) |
| *H05K 3/28* | (2006.01) |
| *H05K 1/16* | (2006.01) |

(52) U.S. Cl.
CPC ............. *H05K 1/183* (2013.01); *H05K 1/115* (2013.01); *H05K 1/182* (2013.01); *H05K 3/4697* (2013.01); *H01L 2224/14* (2013.01); *H01L 2224/16225* (2013.01); *H01L 2224/17* (2013.01); *H01L 2224/48091* (2013.01); *H01L 2224/49109* (2013.01); *H01L 2224/73257* (2013.01); *H01L 2924/00014* (2013.01); *H05K 1/162* (2013.01); *H05K 1/185* (2013.01); *H05K 3/284* (2013.01); *H05K 2201/0919* (2013.01); *H05K 2201/09381* (2013.01); *H05K 2201/10* (2013.01); *H05K 2201/1003* (2013.01); *H05K 2201/10007* (2013.01); *H05K 2201/10022* (2013.01)

(58) Field of Classification Search
CPC .... H05K 1/185; H05K 2201/10; H05K 1/162; H05K 2201/10007; H05K 2201/10015; H05K 2201/10022; H05K 2201/1003; H05K 2201/10037; H05K 3/284
USPC .......................... 361/761–764; 257/787–792
See application file for complete search history.

(56) References Cited

U.S. PATENT DOCUMENTS

| | | | | |
|---|---|---|---|---|
| 5,994,648 A * | 11/1999 | Glovatsky | ............... | H05K 1/183 174/254 |
| 6,531,328 B1 * | 3/2003 | Chen | ........................ | H01L 24/97 438/106 |
| 7,683,393 B2 * | 3/2010 | Nagai | ................... | H01L 33/486 257/98 |

* cited by examiner

*Primary Examiner* — Binh Tran
(74) *Attorney, Agent, or Firm* — NSIP Law (57) ABSTRACT

A printed circuit board including an electronic component and a method of producing the same are provided. The printed circuit board includes a multilayered substrate including an insulation layer and an inner circuit layer laminated therein, a cavity disposed in the multilayered substrate, a via disposed in the insulation layer and configured to electrically connect the inner circuit layer with another inner circuit layer, a first electronic component inserted in the cavity, and a bump pad disposed on a surface of the cavity facing the first electronic component, and the (Continued)

bump pad is formed by having the insulation layer and the via exposed to a lateral side of the cavity.

11 Claims, 9 Drawing Sheets

PRINTED CIRCUIT BOARD WITH EMBEDDED ELECTRONIC COMPONENT AND MANUFACTURING METHOD THEREOF

CROSS-REFERENCE TO RELATED APPLICATIONS

This application claims the benefit under 35 USC 119(a) of Korean Patent Application No. 10-2015-0011203, filed on Jan. 23, 2015, in the Korean Intellectual Property Office, the entire disclosure of which is incorporated herein by reference for all purposes.

BACKGROUND

1. Field

The following description relates to a printed circuit board including a multilayered board with a cavity in which an electronic component is embedded and a method of manufacturing the printed circuit board.

2. Description of Related Art

With the widespread use of smaller, slimmer and more integrated electronic products, the printed circuit package boards used in the electronic products have also become increasingly smaller and slimmer.

To produce electronic products that are multi-functional at lower costs, multiple chips are mounted on multilayered substrates, in which a plurality of circuit layers are formed. To accommodate the chips, a greater mounting area is required to be provided within the given size of a package board.

Conventionally, bump pads are formed on at least one surface of the multilayered substrate to mount an integrated circuit (IC), a passive element, an active element and the like on the one surface of the multilayered substrate. However, as the mounting area is too small to mount multiple devices in the conventional method, the electronic products have been hindered from being truly multi-functional. An example of a package board is disclosed in Published Korean Patent Application 2014-071769.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board including a multilayered substrate including an insulation layer and an inner circuit layer laminated therein, a cavity disposed in the multilayered substrate, a via disposed in the insulation layer and configured to electrically connect the inner circuit layer with another inner circuit layer, a first electronic component inserted in the cavity, and a bump pad disposed on a surface of the cavity facing the first electronic component, in which the bump pad is formed by having the insulation layer and the via exposed to a lateral side of the cavity.

The first electronic component may be a radio-frequency device, an integrated circuit chip, a passive element or an active element.

The general aspect of the printed circuit board may further include support fixture disposed on a bottom surface of the cavity so as to support the first electronic component.

The general aspect of the printed circuit board may further include an encapsulant filling in a space between the cavity and the first electronic component.

The general aspect of the printed circuit board may further include a conductive ball interposed between the bump pad and the first electronic component.

The conductive ball may include a core in an annular shape, an intermediate layer including a conductive material that surrounds an outside of the core, and an adhesive film disposed on the intermediate layer.

A volume of the core may increase or decrease in response to a change in temperature, and the core may hardened at a predetermined temperature.

The core may have an air-filled hollow space formed therein.

The first electronic component may include a connection pad formed on an upper surface thereof, and the connection pad and the bump pad may be connected by a wire.

The general aspect of the printed circuit board may further include a second electronic component coupled to a lateral side of the multilayered substrate.

The second electronic component may be a radio-frequency device, an integrated circuit chip, a passive element or an active element.

In another general aspect, a method of manufacturing a printed circuit board involves preparing a multilayered circuit board including an insulation layer and an inner circuit layer laminated therein, forming a cavity in the multilayered substrate, and mounting a first electronic component in the cavity, in which the forming of the cavity involves forming a bump pad on a surface of the cavity facing the first electronic component.

During the mounting of the first electronic component, a conductive ball may be attached to the bump pad, and the first electronic component may be inserted in the cavity.

During the mounting of the first electronic component, a conductive ball may be attached to the first electronic component, and the first electronic component may be inserted in the cavity.

During the mounting of the first electronic component, the first electronic component may be inserted in the cavity, and the bump pad and the first electronic component may be connected with each other by a wire.

The general aspect of the method may further involve, after the mounting of the first electronic component, injecting an encapsulant into the cavity so as to seal a gap between the cavity and the first electronic component.

The general aspect of the method may further involve, after the forming of the cavity, disposing support fixture on a bottom surface of the cavity so as to support the first electronic component.

The general aspect of the method may further involve, after the mounting of the first electronic component in the cavity, mounting a second electronic component on a lateral side of the multilayered substrate.

Other features and aspects will be apparent from the following detailed description, the drawings, and the claims.

BRIEF DESCRIPTION OF THE DRAWINGS

FIG. 6A and FIG. 6B are sectional views of examples of conductive balls.

FIG. 8A, FIG. 8B, FIG. 8C and FIG. 8D are sectional views illustrating another example of a method of manufacturing an electronic component-embedded printed circuit board.

FIG. 9A, FIG. 9B, FIG. 9C and FIG. 9D are sectional views illustrating processes of forming a via to a bump pad according to an example of a method of manufacturing an electronic component-embedded printed circuit board. FIG. 9A is a sectional view illustrating the forming of the via.

FIG. 10A, FIG. 10B and FIG. 10C are sectional views illustrating processes of forming an inner circuit layer to a bump pad according to an example of a method of manufacturing an electronic component-embedded printed circuit board.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terms used in the description are intended to describe various examples, and are not intended to limit the present description. Unless clearly used otherwise, expressions in a singular form include a meaning of a plural form. In the present description, an expression such as "comprising" or "including" is intended to designate a characteristic, a number, a step, an operation, an element, a part or combinations thereof, and shall not be construed to preclude any presence or possibility of one or more other characteristics, numbers, steps, operations, elements, parts or combinations thereof.

In a package board in which bump pads are formed to mount an IC, a passive element, an active element and the like on a multilayered substrate, a large mounting area is used to mount multiple devices.

According to an example of a package board described below, an expanded area for mounting an electronic component is provided by installing the electronic component inside a cavity of a multilayered substrate and/or on a lateral surface of the multilayered substrate.

Figure 1:
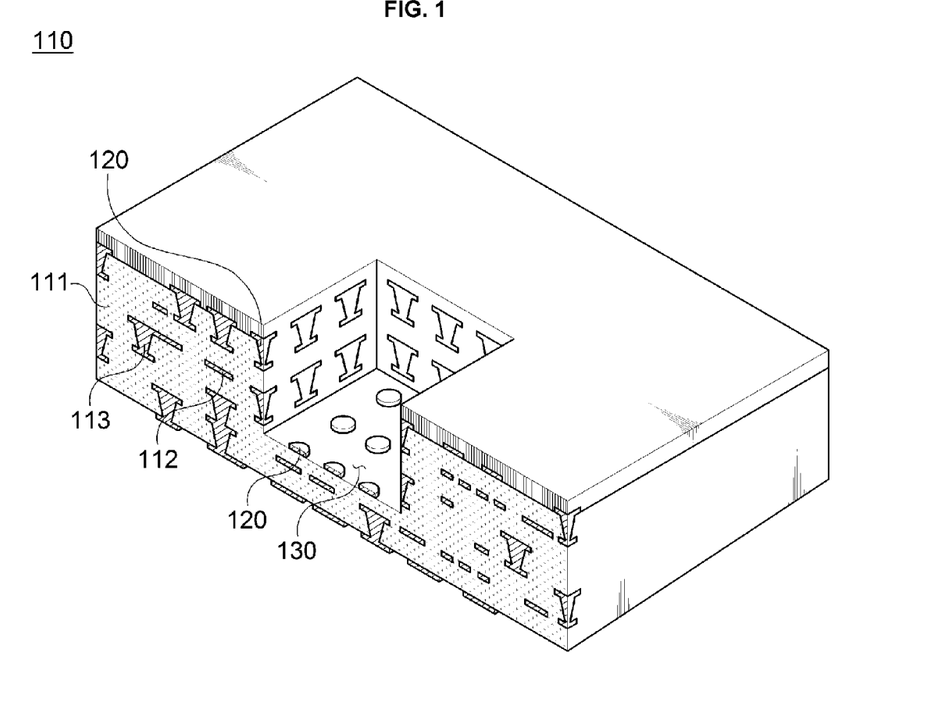
FIG. 1 is a perspective view illustrating an example of a multilayered substrate applied to an electronic component-embedded printed circuit board.
Figure 2:
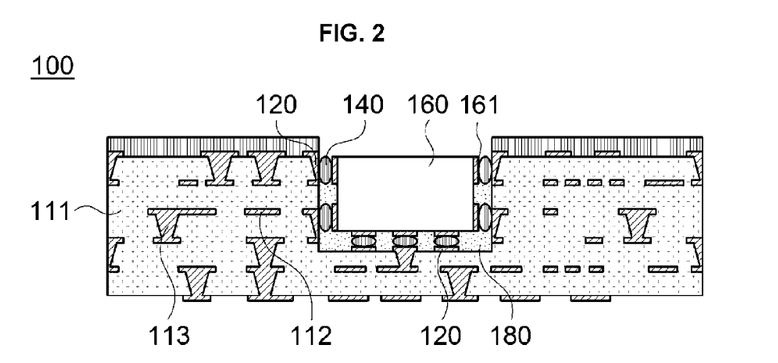
FIG. 2 is a sectional view illustrating an example of an electronic component-embedded printed circuit board.
Figure 3:
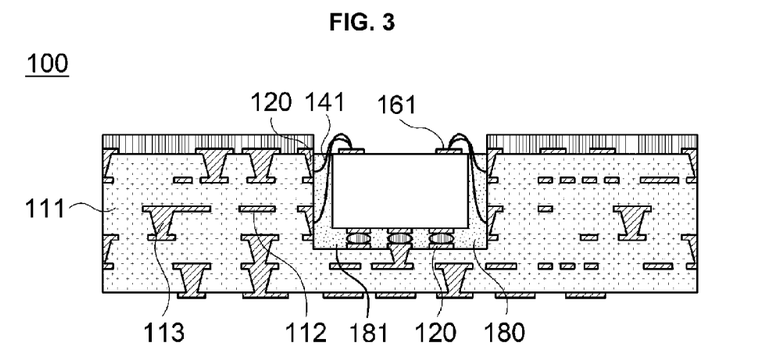
FIG. 3 is a sectional view illustrating a first electronic component wire-mounted in a cavity in a modified example of the electronic component-embedded printed circuit board according to FIG. 2.

FIG. 1 illustrates an example of a multilayered substrate applied to an electronic component-embedded printed circuit board in accordance with the present description. FIG. 2 is a sectional view showing the example of the electronic component-embedded printed circuit board illustrated in FIG. 1. FIG. 3 is a sectional view illustrating a first electronic component wire-mounted in a cavity in a modified example of the electronic component-embedded printed circuit board.

Referring to FIG. 1 to FIG. 3, an electronic component-embedded printed circuit board 100 includes a multilayered substrate 110 in which an insulation layer 111, mainly made of a resin insulation material, and an inner circuit layer 112 are alternately laminated.

The insulation layer 111 may be made of a photo-curable or thermosetting resin insulation material, a build-up material including a cured product of a resin containing a photosensitive monomer or a thermosetting resin such as epoxy.

The insulation layer 111 may have the inner circuit layer 112 formed on at least one surface thereof by having a metal pattern printed thereon. Referring to FIG. 1, at least some of surfaces of the multilayered substrate 110 may include a connection terminal with the inner circuit layer 112 exposed. The connection terminal may be an area on which electronic components such as a passive element and an active element are mounted.

The inner circuit layer 112 may be insulated by the insulation layer 111. A via 113 may be formed in the insulation layer 111, and inner circuit layers 112 formed above and below the insulation layer 111, respectively, may be electrically connected with each other through the via 113. The via 113 may be tapered in one direction, that is, downwardly, or toward a center thereof to have the shape of an hourglass.

The multilayered substrate 110 may have a cavity 130 formed in at least one surface thereof. The cavity 130, which is an area for mounting an electronic component, may be sunk in the multilayered substrate 110. By having the cavity 130 sunk in the multilayered substrate 110, the electronic component inserted in the cavity 130 may not be protruded or may be little protruded over the surface of the multilayered substrate 110, contributing to implementing a thinner and lighter electronic component-embedded printed circuit board.

Referring to FIG. 1, a surface of the cavity 130 includes bump pads 120 for electrical connection with the electronic component 160. Referring to an example illustrated in FIG. 2, the bump pads 120 are formed to correspond to a configuration of a first electronic component 160, and conductive balls 140 are interposed between the bump pads 120 and the first electronic component 160 for electrical connection between the bump pad 120 and the first electronic component 160. An example of a method of forming the bump pad 120 will be described later in detail as a part of a method of manufacturing an electronic component-embedded printed circuit board.

The first electronic component 160, which is inserted in the cavity 130, may be a passive element, such as a capacitor, a resistor, an inductor or a filter, or an active element, such as an integrated circuit (IC) chip or an amplifier, or a radio-frequency (RF) element.

The first electronic component 160 may include an external electrode being electrically connected with the multilayered substrate 110, and the external electrode may be constituted with a connection pad 161. The bump pad 120 formed on a lateral surface of the cavity 130 may be connected with the connection pad 160 formed on a surface of the first electronic component 160 by the conductive ball 140 or a wire.

The cavity 130 may further include support fixture 181, for supporting the first electronic component 160, on a bottom surface thereof. The support fixture 181 may align positions of the external electrode of the first electronic component 160 mounted in the cavity 130 and the bump pad 120 formed on the cavity 130, and prevent the aligned first electronic component 160 from moving. The support fixture may contain a known material having an insulating property and may further contain a material having an adhesive property in order to fasten the first electronic component 160.

Referring to FIG. 2, the conductive balls 140 are interposed between the first electronic component 160 and the bump pads 120. By heating the conductive balls 140 after interposing the conductive balls 140 between the first electronic component 160 and the cavity 130, the conductive balls 140 may be expanded to an empty space between the first electronic component 160 and the cavity 130 as a volume of the conductive ball 140 is expanded by the elevated temperature. As a result, the first electronic component 160 and the bump pad 120 may be electrically connected with each other.

Meanwhile, the connection pad 161 formed on an upper surface of the first electronic component 160 may be connected with the bump pad 120 by way of a wire 141. According to one example, the wire 141 is connected with the bump pad 120 formed on the lateral surface of the cavity 130 because the space between the first electronic component 160 and the cavity 130 is narrow.

After the first electronic component 160 is mounted and electrically connected with the bump pad 120, the space between the first electronic component 160 and the cavity 130 may be sealed by having an encapsulant 180 filled therein. If moisture were brought into the space between the first electronic component 160 and the cavity 130, a crack might be caused in the multilayered substrate 110, and the moisture might deteriorate electric connectivity of the conductive ball 140. Moreover, in the event that the first electronic component 160 moves during other processes, the movement may cause a crack or disconnection of the conductive ball 140. Therefore, the encapsulant 180 may protect the conductive ball 140 and the first electronic component 160 from external stimulation by protecting the conductive ball 140 and fastening the first electronic component 160.

The encapsulant 180 may be made of a resin, a molded under-fill (MUF) or the like having an insulating property. The encapsulant 180 having small particles may be readily filled in between the first electronic component 160 and the cavity 130, and thus may seal a gap of the cavity 130. Moreover, the encapsulant 180 may dissipate heat generated by the first electronic component 160.

Figure 4:
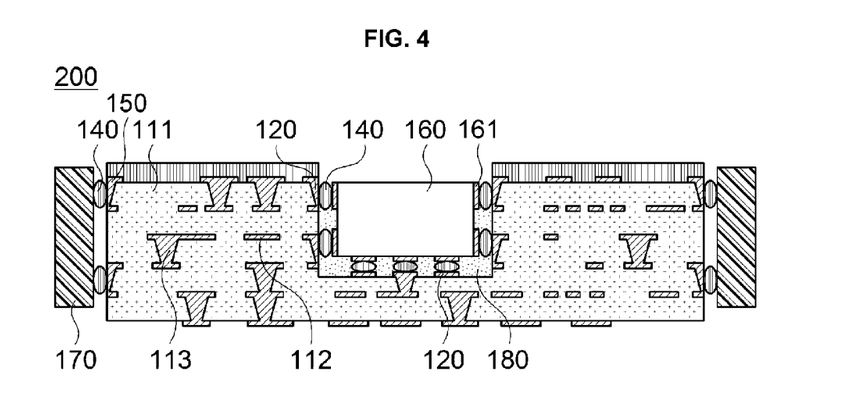
FIG. 4 is a sectional view illustrating another example of an electronic component-embedded printed circuit board.
Figure 5:
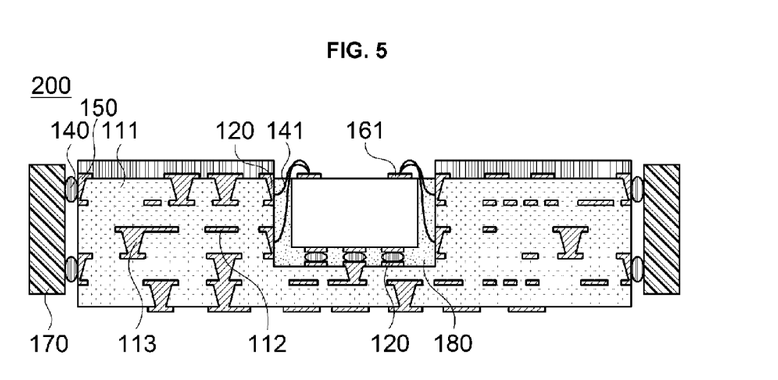
FIG. 5 is a sectional view illustrating a first electronic component wire-mounted in a cavity in a modified example of the electronic component-embedded printed circuit board according to FIG. 4.

As illustrated in FIGS. 4 and 5, in another embodiment of the present description, the multilayered substrate 110 may have a second electronic component 170 coupled to a lateral side thereof. The multilayered substrate 110 may further include an external pad 150 on both lateral surfaces thereof for electrical connection of the second electronic component 170 with the inner circuit layer 112 or the via 113 of the multilayered substrate 110.

The second electronic component 170 may be a passive element, such as a capacitor, a resistor, an inductor or a filter, or an active element, such as an IC chip or an amplifier, or an RF element. As the second electronic component 170 is installed on a lateral surface of the multilayered substrate 110, and the first electronic component 160 in the cavity and other electronic components on a surface of the multilayered substrate 110, an electronic product having applied thereon an electronic component-embedded printed circuit board 200 in accordance with the present embodiment may exhibit a higher performance and functionality.

The second electronic component 170 may be coupled to the multilayered substrate 100 by a solder having an electric conductivity. Alternatively, the second electronic component 170 may be coupled with the multilayered substrate 110 by way of the conductive ball 140.

A method of forming the external pad 150 will be described later in greater detail when the method of manufacturing an electronic component-embedded printed circuit board is described.

Figure 6A:
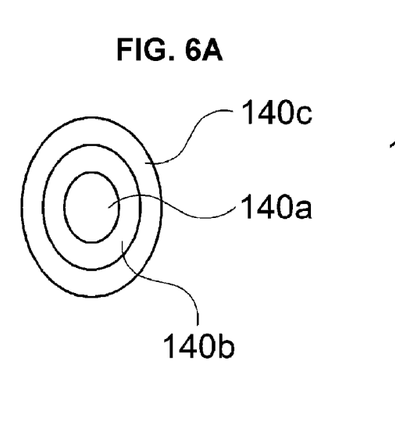
FIG. 6A illustrates an example of a conductive ball having a three-layer structure.
Figure 6B:
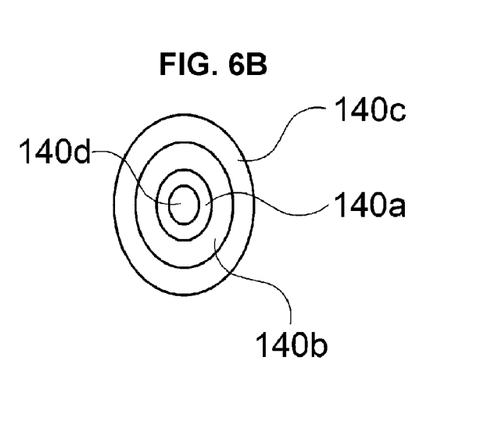
FIG. 6B illustrates an example of a conductive ball having a four-layer structure.

FIGS. 6A and 6B illustrate sectional views of examples of conductive balls. FIG. 6A illustrates a conductive ball having a three-layer structure, and FIG. 6B illustrates a conductive ball having a four-layer structure.

The conductive ball 140 is a medium for connecting a substrate with an electronic component. The conductive ball 140 may be made of a known material having an electrically conductive property, such as, for example, solder.

Alternatively, the conductive ball 140 may be constituted with an annular core 140a formed at an inside thereof, an intermediate layer 140b made of a conductive material, and an adhesive film 140c formed at an outermost portion thereof. The volume of the core 140a may vary in response to a rise or a drop in temperature, and may expand in response to a drop in pressure. The core 140a may also be hardened at a predetermined temperature.

The core 140a may be formed in a hollow structure, in which a hollow space 140d is formed therein. That is, the core 140a may take a form in which air is filled inside thereof. Since air is easily expanded by a rising temperature, adhesiveness may be improved when the conductive ball 140 is expanded, and it is possible to save the cost of materials used for the core 140*a*.

The intermediate layer 140*b* may be made of a flexible material having a good conductivity, for example, Au, Ag, conductive fiber, graphite or the like.

The adhesive film 140*c* may be made of an ACF bonding film, which is an epoxy resin allowing the conductive ball 140 to be adhered to the electronic component or the bump pad 120. The conductive ball 140 may be inserted in the cavity 130 by being attached to the external electrode of the first electronic component 160 first and then having the first electronic component 160 to be inserted in the cavity 130. Alternatively, the conductive ball 140 may be attached to the bump pad 120 formed on the surface of the cavity 130 first before having the first electronic component 160 to be inserted in the cavity 130. In the case of the latter, since the conductive ball 140 may be pre-inserted in a narrow space between the cavity 130 and the first electronic component 160, it is possible to prevent a bad electrical connection of the conductive ball 140 or a short circuit caused by a contact between adjacent conductive balls 140.

Figure 7:
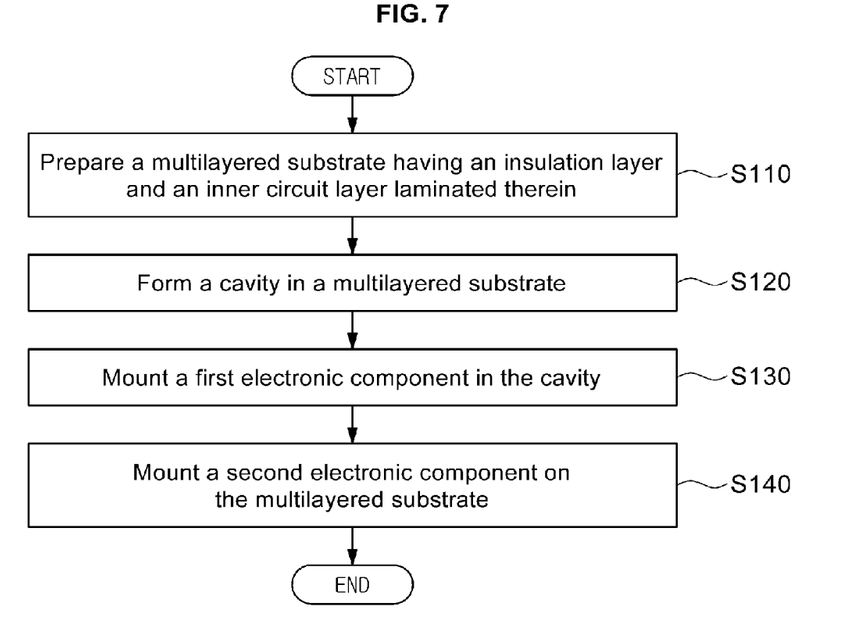
FIG. 7 is a flow diagram of an example of a method of manufacturing an electronic component-embedded printed circuit board.
Figure 8A:
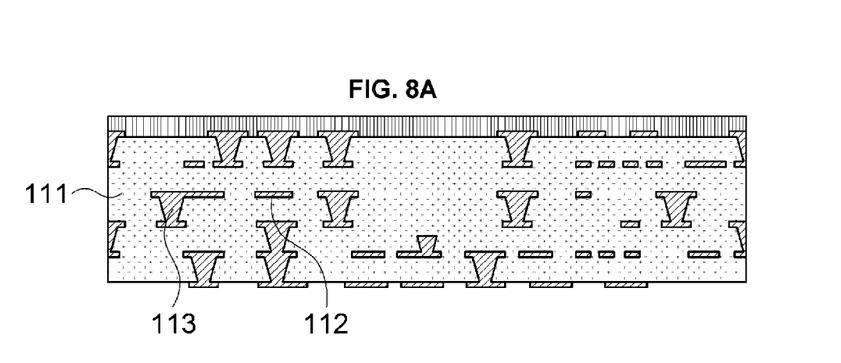
FIG. 8A is a sectional view illustrating the preparing of a multilayered substrate having an insulation layer and an inner circuit layer laminated therein according the example.
Figure 8B:
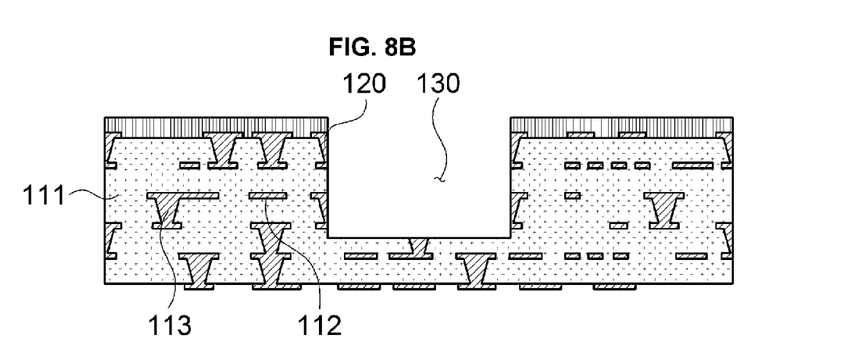
FIG. 8B is a sectional view illustrating the forming of a cavity.
Figure 8C:
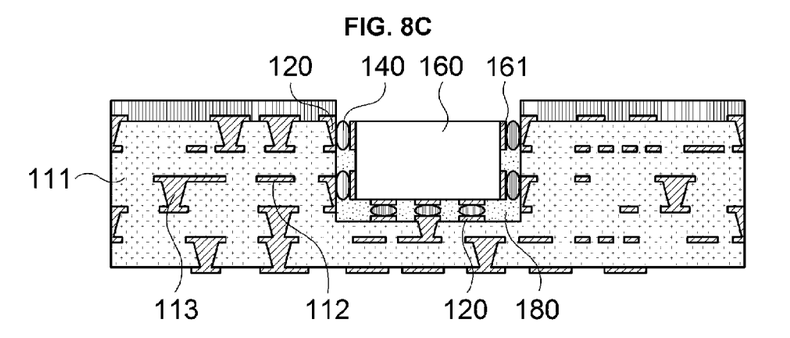
FIG. 8C is a sectional view illustrating the mounting of the first electronic component in the cavity.
Figure 8D:
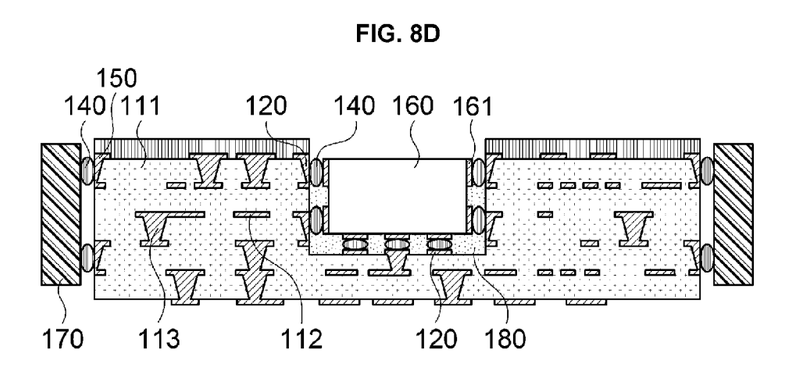
FIG. 8D is a sectional view illustrating the mounting of a second electronic component.

Hereinafter, an example of a method of manufacturing an electronic component-embedded printed circuit board will be described. FIG. 7 is a flow diagram illustrating an example of a method of manufacturing the electronic component-embedded printed circuit board. FIG. 8A, FIG. 8B, FIG. 8C and FIG. 8D are sectional views illustrating processes used in the example of the method of manufacturing the electronic component-embedded printed circuit board. FIG. 8A illustratess the preparing of a multilayered substrate having an insulation layer and an inner circuit layer laminated therein. FIG. 8B illustrates the forming of a cavity. FIG. 8C illustrates the mounting of the first electronic component in the cavity. FIG. 8D illustrates the mounting of a second electronic component.

Referring to the example illustrated in FIG. 7 through FIG. 8D, the method of manufacturing the electronic component-embedded printed circuit board includes the preparing of a multilayered substrate 110 having an insulation layer 111 and an inner circuit layer 112 laminated therein (S110), the forming of a cavity 130 (S120), the mounting of a first electronic component 160 in the cavity 130 (S130), and the mounting of a second electronic component 170 (S140).

Referring to FIG. 8A, in the preparing of the multilayered substrate 110 (S110), the inner circuit layer 112 is formed by having at least one metal pattern printed on a surface of the insulation layer 111, and a via 113 is formed in the insulation layer 111 so as to make an electrical connection between the inner circuit layer 112 and another inner circuit layer 112 formed on another layer.

Then, referring to FIG. 8B, an area in which the first electronic component 160 can be inserted is formed by forming the cavity 130 on one surface of the multilayered substrate 110 (S120). The cavity 130 may be formed by $CO_2$ or YAG laser processing or CNC drilling.

At least a portion of a surface of the cavity 130 may have a bump pad 120 formed thereon for electrical connection with the first electronic component 160, and the bump pad 120 may be formed by having the inner circuit layer 112 or the via 113 exposed on the surface of the cavity 130.

Next, referring to FIG. 8C, in the mounting of the first electronic component 160 in the cavity 130, a conductive ball 140 connects the bump pad 120 with the first electronic component 160 electrically through a reflow process (S130).

A core 140*a* of the conductive ball 140 has a volume thereof expanded when temperature rises, but not in a particular direction. Accordingly, a rotating process may be required in order to control the expansion of the conductive ball 140 in one horizontal direction. For this, a structure for rotating the multilayered substrate 110 about a central axis of the cavity 130 may be provided on a bottom surface of the multilayered substrate 110. By having the multilayered substrate 110 rotated by the rotating structure, the conductive ball 140 may be moved horizontally by a centrifugal force. As the conductive ball 140 adhered to a lateral surface of the cavity 130 is moved to the lateral surface of the cavity, the first electronic component 160 and the bump pad 120 are connected with each other.

Then, referring to FIG. 8D, the second electronic component 170 is mounted on a lateral side of the multilayered substrate 110 (S140). The lateral side of the multilayered substrate 110 has an external pad 150 provided thereon for mounting the second electronic component 170 thereon.

Figure 9A:
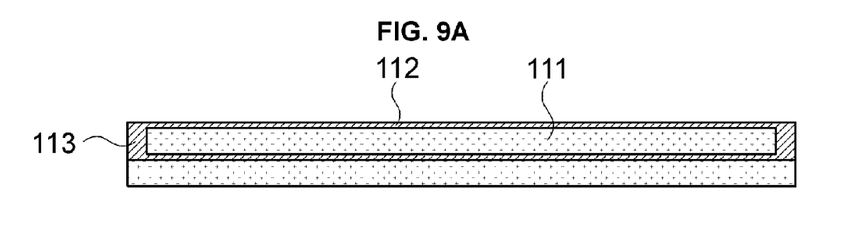
Figure 9B:
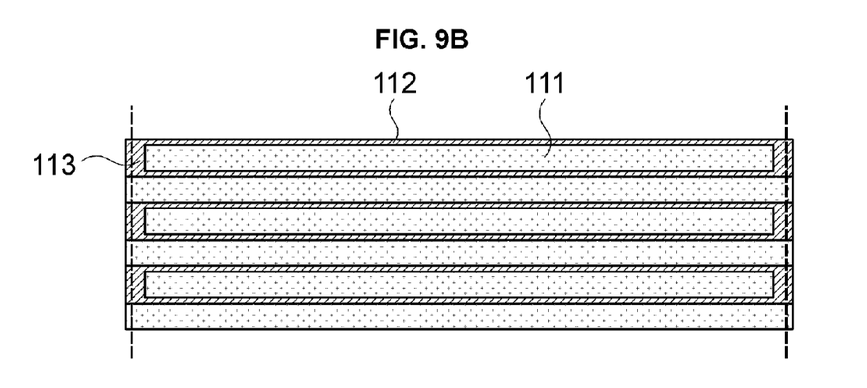
FIG. 9B is a section view illustrating the severing and exposing of the via.
Figure 9C:
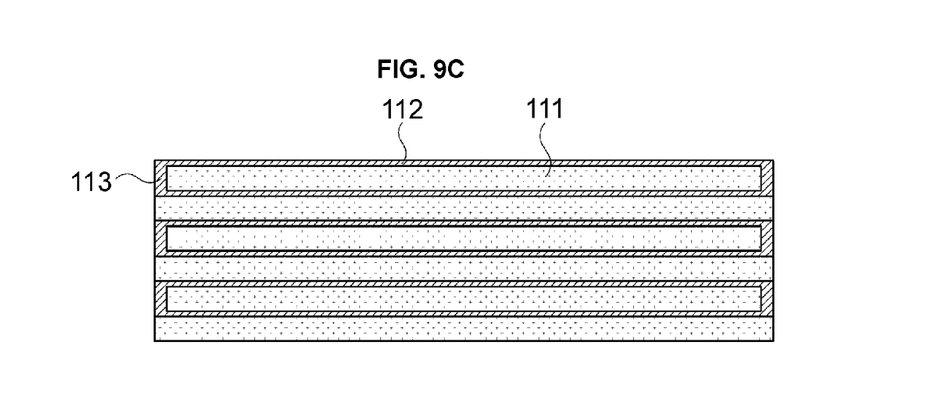
FIG. 9C is a sectional view illustrating the process of having the via exposed to a lateral surface.
Figure 9D:
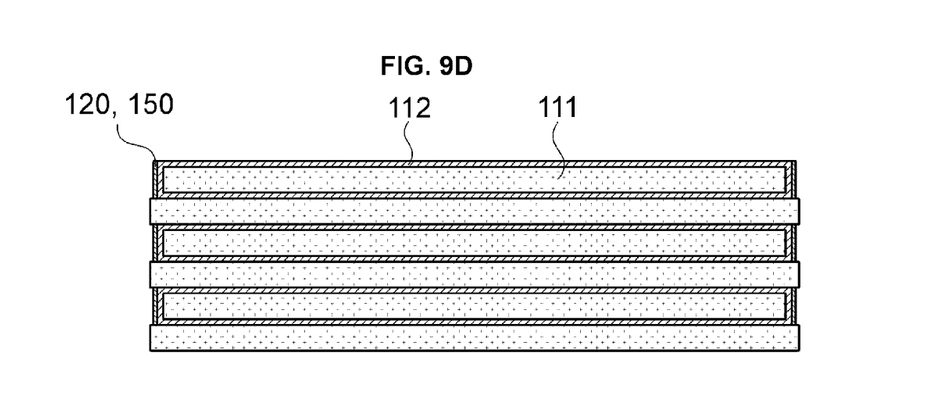
FIG. 9D is a sectional view illustrating the process of forming the bump pad by etching and surface-treating the exposed via.
Figure 10A:
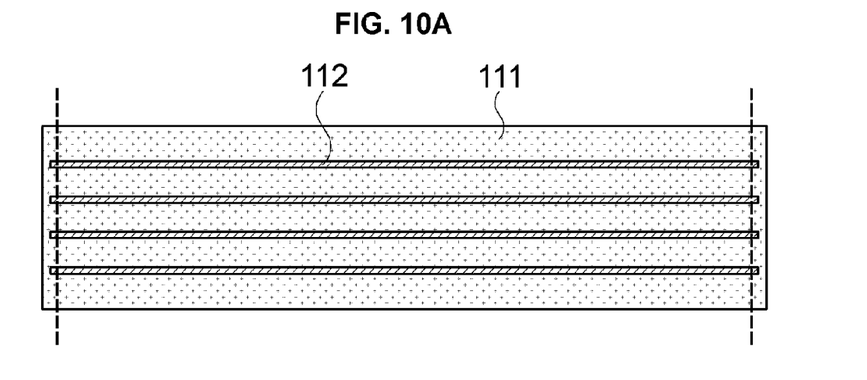
FIG. 10A is a sectional view illustrating the exposing of the inner circuit layer by severing a lateral end of a multilayered substrate.
Figure 10B:
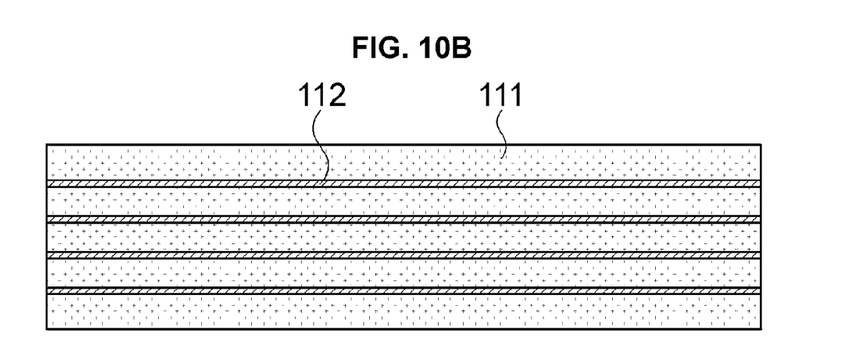
FIG. 10B is a sectional view illustrating the process of having the inner circuit layer exposed to a lateral surface.
Figure 10C:
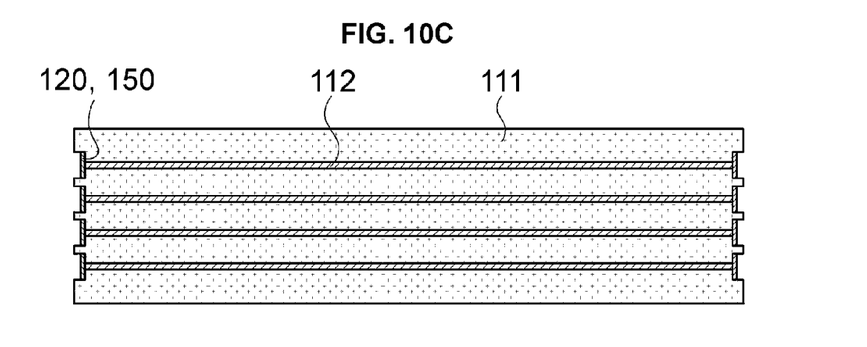
FIG. 10C is a sectional view illustrating the process of forming the bump pad by etching and surface-treating the exposed inner circuit layer.

The forming of the bump pad 120 and the external pad 150 will be described with reference to FIG. 9A through FIG. 10C. FIG. 9A, FIG. 9B, FIG. 9C and FIG. 9D are sectional views illustrating the forming of a via to a pad, and FIG. 9A is a sectional view illustrating the forming of the via. FIG. 9B illustrates the severing and exposing of the via. FIG. 9C illustrates the process of having the via exposed to a lateral surface. FIG. 9D illustrates the forming of the pad by etching and surface-treating the exposed via. FIG. 10A, FIG. 10B and FIG. 10C are sectional views illustrating the processes of forming an inner circuit layer to a pad. FIG. 10A is a sectional view illustrating the exposing of the inner circuit layer by severing a lateral end of a multilayered substrate. FIG. 10B illustrates the process of having the inner circuit layer exposed to a lateral surface. FIG. 10C illustrates the forming of the pad by etching and surface-treating the exposed inner circuit layer.

Referring to FIG. 9A through FIG. 9D, the bump pad 120 and the external pad 150 are formed by vertically severing the via 113, exposing a lateral side thereof and backend processing the exposed lateral side.

Although FIG. 9A to FIG. 9D illustrate that the via 113 has a straight shape, the via 113 may be tapered toward one direction or have an hourglass shape by being tapered toward a middle portion thereof. As electric conductivity is improved with an increased area of exposure of the bump pad 120 and the external pad 150, the via 113 may be severed about a vertical central axis thereof to maximize the exposed area of the via 113.

The via 113 exposed through processing the cavity 130 may have a sunk portion formed therein through a Cu etching process. As the sunk portion is formed to be lower than the insulation layer 111, the conductive ball 140 may be precisely located when being attached to the bump pad 120.

Next, a metal layer may be formed in the sunk portion. The metal layer may improve a contact when the conductive ball 140 is attached. While the metal layer may be formed by electrolytic plating, electroless plating or any other screen printing, the method of forming the metal layer is not limited to these methods.

Then, referring to FIG. 10A to FIG. 10C, the bump pad 120 and the external pad 150 may be formed by vertically severing the inner circuit layer 112, exposing a lateral side thereof and backend processing the exposed lateral side. By severing a lateral surface of the multilayered substrate 110 in which the inner circuit layer 112 and the insulation layer 111 are alternately laminated, the inner circuit layer 112 is exposed to the lateral side.

Afterwards, like the method of forming the bump pad 120 and the external pad 150 using the via 113, the bump pad 120 and the external pad 150 may be formed through the Cu etching process and the metal layer forming process.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a multilayered substrate comprising an insulation layer and an inner circuit layer laminated therein, a cavity disposed in the multilayered substrate;
   a via disposed in the insulation layer and configured to electrically connect the inner circuit layer with another inner circuit layer;
   a first electronic component inserted in the cavity; and
   a bump pad disposed on a surface of the cavity facing the first electronic component,
   wherein the bump pad comprises the insulation layer and the via exposed to a lateral side of the cavity,
   wherein the via comprises a sunk portion at the lateral side of the cavity.

2. The printed circuit board according to claim 1, wherein the first electronic component is a radio-frequency device, an integrated circuit chip, a passive element or an active element.

3. The printed circuit board according to claim 1, further comprising support fixture disposed on a bottom surface of the cavity so as to support the first electronic component.

4. The printed circuit board according to claim 1, further comprising an encapsulant filling in a space between the cavity and the first electronic component.

5. The printed circuit board according to claim 1, further comprising a conductive ball interposed between the bump pad and the first electronic component.

6. The printed circuit board according to claim 5, wherein the conductive ball comprises:
   a core in an annular shape;
   an intermediate layer comprising a conductive material that surrounds an outside of the core; and
   an adhesive film disposed on the intermediate layer.

7. The printed circuit board according to claim 6, wherein a volume of the core increases or decrease in response to a change in temperature, and the core is hardened at a predetermined temperature.

8. The printed circuit board according to claim 6, wherein the core has an air-filled hollow space formed therein.

9. The printed circuit board according to claim 1, wherein the first electronic component comprises a connection pad formed on an upper surface thereof, and
   wherein the connection pad and the bump pad are connected by a wire.

10. The printed circuit board according to claim 1, further comprising a second electronic component coupled to a lateral side of the multilayered substrate.

11. The printed circuit board according to claim 10, wherein the second electronic component is a radio-frequency device, an integrated circuit chip, a passive element or an active element.

* * * * *